US009455150B2

(12) United States Patent
Clendenning et al.

(10) Patent No.: US 9,455,150 B2
(45) Date of Patent: Sep. 27, 2016

(54) CONFORMAL THIN FILM DEPOSITION OF ELECTROPOSITIVE METAL ALLOY FILMS

(71) Applicant: Intel Corporation, Santa Clara, CA (US)

(72) Inventors: Scott B. Clendenning, Portland, OR (US); Patricio E. Romero, Portland, OR (US); Gilbert Dewey, Hillsboro, OR (US)

(73) Assignee: INTEL CORPORATION, Santa Clara, CA (US)

( * ) Notice: Subject to any disclaimer, the term of this patent is extended or adjusted under 35 U.S.C. 154(b) by 30 days.

(21) Appl. No.: 14/140,042

(22) Filed: Dec. 24, 2013

(65) Prior Publication Data

US 2015/0179798 A1    Jun. 25, 2015

(51) Int. Cl.
*H01L 21/28* (2006.01)
*H01L 29/78* (2006.01)
*H01L 29/66* (2006.01)
*H01L 29/45* (2006.01)
*H01L 29/49* (2006.01)
*H01L 29/06* (2006.01)
*H01L 29/51* (2006.01)

(52) U.S. Cl.
CPC ... *H01L 21/28088* (2013.01); *H01L 21/28176* (2013.01); *H01L 29/0676* (2013.01); *H01L 29/45* (2013.01); *H01L 29/4966* (2013.01); *H01L 29/4975* (2013.01); *H01L 29/517* (2013.01); *H01L 29/66795* (2013.01); *H01L 29/7851* (2013.01)

(58) Field of Classification Search
None
See application file for complete search history.

(56) References Cited

U.S. PATENT DOCUMENTS

| 5,399,917 | A | 3/1995 | Allen et al. |
| 5,828,591 | A | 10/1998 | Rotstain |
| 8,362,220 | B2 | 1/2013 | Girolami et al. |
| 8,440,556 | B2 | 5/2013 | Clendenning et al. |
| 2007/0284646 | A1* | 12/2007 | Kikuchi ............ G11C 16/0466 257/315 |
| 2013/0129593 | A1 | 5/2013 | Girolami et al. |

FOREIGN PATENT DOCUMENTS

| WO | 2013048417 A1 | 4/2013 |
| WO | 2013095343 A1 | 6/2013 |
| WO | 2013095651 A1 | 6/2013 |

OTHER PUBLICATIONS

Daly, et al.; "Lanthanide N,N-Dimethylaminodiboranates: Highly Volatile Precursors for the Deposition of Lanthanide-Containing Thin Films"; Received Nov. 19, 2009, American Chemical Society, J.Am.Chem.Soc. 2010, vol. 132, No. 7, 2010; pp. 2106-2107.

(Continued)

*Primary Examiner* — Bilkis Jahan
*Assistant Examiner* — Kevin Quinto
(74) *Attorney, Agent, or Firm* — Grossman, Tucker, Perrault & Pfleger, PLLC

(57) ABSTRACT

The present disclosure relates to a method of forming a semiconductor. The method includes heating a substrate in a reaction chamber, supplying to the reaction chamber a first constituent including a metal borohydride wherein the metal borohydride includes at least one of: an alkaline earth metal, a transition metal, or a combination thereof; supplying to the reaction chamber a main-group hydride constituent; and depositing a metal compound on the substrate, wherein the metal compound comprises a) at least one of an alkaline earth metal a transition metal or a combination thereof, b) boron and c) optionally the main group alloying element.

13 Claims, 7 Drawing Sheets

(56) References Cited

OTHER PUBLICATIONS

Daly, et al.; "Synthesis, Characterization, and Structures of Divalent Europium and Ytterbium N, N-Dimethylaminodiboranates", Feb. 11, 2010, Published on Web Apr. 14, 2010; Inorg. Chem. 2010, 49, pp. 4578-4585.

Daly, et al.; "Lanthanide N,N-Dimethylaminodiboranates as a New Class of Highly Volatile Chemical Vapor Deposition Precursors"; Aug. 24, 2011, Published Jun. 11, 2012, Inorganic Chemistry Article 2012, pp. 7050-7065.

Vlaisavljevich, et al.; "Volatilities of Actinide and Lanthanide N,N-Dimethylaminodiboranate Chemical Vapor Deposition Precursors: A DFT Study"; Jun. 11, 2012, Published Oct. 5, 2012, the Journal of Physical Chemistry, 3p. 23194-23200.

* cited by examiner

CONFORMAL THIN FILM DEPOSITION OF ELECTROPOSITIVE METAL ALLOY FILMS

FIELD

The present disclosure relates to conformal thin film deposition of electropositive metal alloy films and, in particular, films with tunable, n-type work functions on silicon for relatively low power device operation.

BACKGROUND

As semiconductor devices shrink, the use of three dimensional topology increases. Near band edge work function metals are of increased importance for achieving desirable low power device performance. Due to the reactivity and mobility of electropositive metals, integration problems arise in incorporating such metals in device gate and contact regions. Atomic layer deposition (ALD) and other forms of chemical vapor deposition (CVD) of metal carbides or carbonitrides containing electropositive elements such as titanium, tantalum and aluminum have been used to deposit n-type work function material on silicon. However, these materials tend to exhibit limited n-shift in their electronic properties (particularly, in their flat-band voltages), exhibit relatively high resistivity, and require a metal diffusion barrier in integration.

BRIEF DESCRIPTION OF THE DRAWINGS

The above-mentioned and other features of this disclosure, and the manner of attaining them, may become more apparent and better understood by reference to the following description of embodiments described herein taken in conjunction with the accompanying drawings, wherein.

DESCRIPTION

The present disclosure relates to conformal film deposition of electropositive metal alloy films, and in particular, films with tunable n-type work functions on silicon for relatively low power device operation. In embodiments, the metal alloy compounds described herein are used to form gates and contacts in semiconductor devices, such as complementary metal-oxide-semiconductor (CMOS) transistors and, particularly, in NMOS transistors on silicon, for use in integrated circuits as well as other semiconductor applications where low work function materials are applicable. In addition, the methods of forming the transistors, semiconductor devices, and integrated circuits described herein are applicable to devices having a node size in the range of 5 nm to 50 nm; however, they can be applied to devices having larger node sizes as well.

The metal alloy compounds employed herein are referred to as n-type metal compounds, i.e., n-type work function materials on silicon. N-type metal compounds are understood as compounds that are negative charge conductors or that have an abundance of electrons. Work function affects the operating voltage of the semiconductor devices. For example, the work function difference between the gate and the semiconductor influences the threshold voltage required to form an inversion layer in a transistor.

The films are deposited by chemical vapor deposition and, in particular embodiments, atomic layer deposition. Furthermore, in embodiments, the chemical vapor deposition process or atomic layer deposition process is thermal, wherein the substrate is heated during deposition. Embodiments of these processes are described further below. Other deposition processes may be used as well, such as molecular beam epitaxy.

The deposition processes utilize at least two constituents to form the metal compounds. In embodiments, a first constituent includes a metal borohydride and a second constituent includes a main-group hydride. Depending on the deposition process, the constituents are supplied to the reaction chamber together or individually as described further herein.

Figure 1:
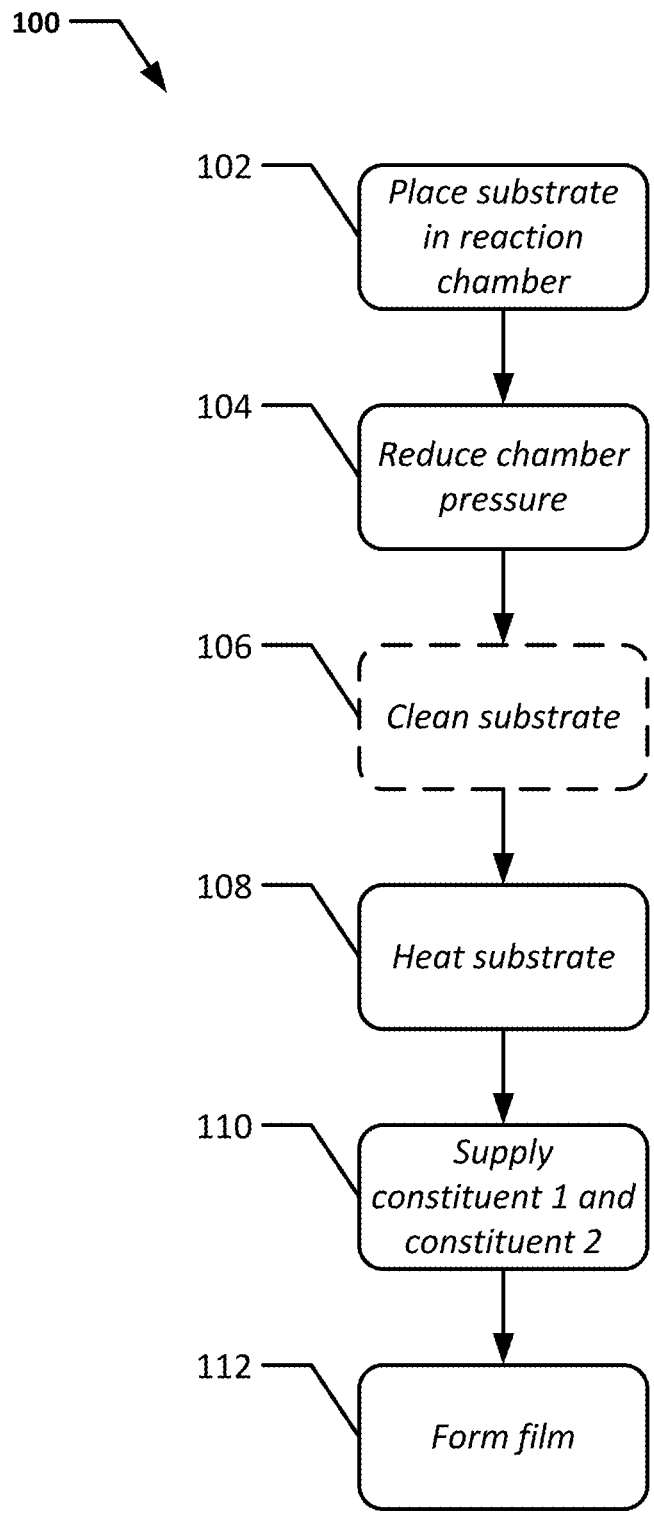
FIG. 1 illustrates a flow chart of an embodiment of a method of chemical vapor deposition.

FIG. 1 illustrates an embodiment of a method 100 of chemical vapor deposition. A substrate, such as a semiconductor wafer, is placed within a reaction chamber 102. The reaction chamber pressure is adjusted 104 to a pressure below $1\times10^{-3}$ torr, such as in the range of $1\times10^{-3}$ to $1\times10^{-8}$ torr or $1\times10^{-6}$ to $1\times10^{-8}$ torr. This is accomplished by one or more vacuum pumps in one or more stages. The substrate is optionally cleaned 106 using, for example, inert gas plasma. In particular embodiments of the above, the substrate is heated 108 to a temperature in the range of 50° C. to 300° C., including all values and ranges therein, such as 90° C. to 300°, 100° C. to 250° C., 150° C. to 200° C., etc. When the cleaning step is performed, heating may occur during the optional cleaning step 106 or after the optional cleaning step 106.

Then the constituents are metered into the reaction chamber together 110. In embodiments, the first constituent, the metal borohydride, is supplied to the reaction chamber using either its own vapor pressure or with the assistance of a carrier gas such as Ar or $N_2$ flowing at a rate of 10 sccm to 1000 sccm, including all values and ranges therein. In addition, or alternatively, the metal borohydride may be heated between 30° C. to 200° C. in order to develop sufficient vapor pressure for delivery. The second constituent, the main-group hydride, is supplied to the reaction chamber at a rate of 10 sccm to 1000 sccm, including all values and ranges therein. Optionally, an additional gas is supplied to the chamber, such as nitrogen, argon or hydrogen, at a rate of 10 sccm to 2000 sccm including all values and ranges therein. The gasses are metered into the chamber for a sufficient period of time such as in the range of 5 seconds to 600 seconds, including all values and ranges therein, to form a film of a desired thickness 112. In embodiments, the pressure of the chamber during deposition is maintained at a pressure below 100 torr, such as in the range of 10 to $1\times10^{-6}$ torr.

Figure 2:
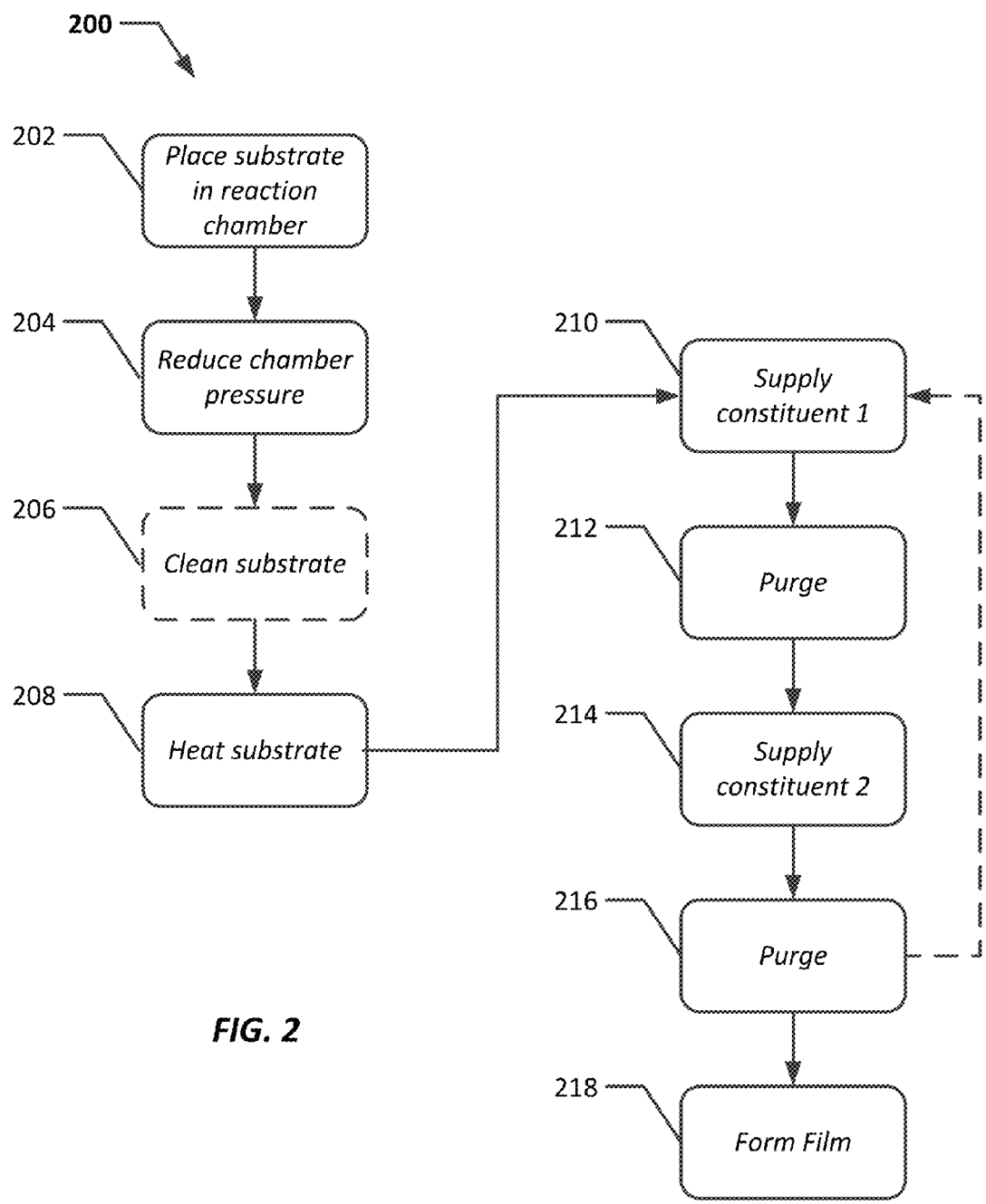
FIG. 2 illustrates a flow chart of an embodiment of a method of atomic layer deposition.

FIG. 2 illustrates an embodiment of atomic layer deposition 200. Similar to chemical vapor deposition, a substrate, such as a semiconductor wafer, is placed within a reaction chamber 202. The reaction chamber pressure is brought to a pressure below 1×10⁻³ torr, such as in the range of $1 \times 10^{-6}$ to $1 \times 10^{-8}$ torr, see 204. This is accomplished by one or more vacuum pumps in one or more stages. The substrate is optionally cleaned 206 using, for example, inert gas plasma. In particular embodiments of the above, the substrate is heated 208 to a temperature in the range of 50° C. to 300° C., including all values and ranges therein, such as 90° C. to 300° C., 100° C. to 250° C., 150° C. to 200° C., etc. In embodiments, when cleaning is performed, heating may occur during the optional cleaning step 206 or after the optional cleaning step 206.

Then the constituents are metered into the reaction chamber in an alternating manner. In embodiments, the first constituent, the metal borohydride, is supplied to the reaction chamber 210 and excess is purged from the chamber 212 utilizing an inert gas such as argon. Then the second constituent, the main-group hydride, is supplied to the reaction chamber 214 and excess is purged from the chamber 216 utilizing an inert gas such as argon. This process continues and is repeated, until a desired layer thickness is achieved and the film is formed 218.

In embodiments, the first constituent is supplied to the reaction chamber with its own vapor pressure or with the assistance of a carrier gas such as Ar or $N_2$ flowing at a rate of 10 sccm to 1000 sccm, including all values and ranges therein. The metal borohydride constituent may be heated between 30° C. to 200° C. in order to develop sufficient vapor pressure for delivery. The second constituent is supplied to the reaction chamber at a rate of 10 sccm to 1000 sccm, including all values and ranges therein. In embodiments, the pressure of the chamber during deposition is maintained at a pressure below 100 torr, such as in the range of 10 to $1 \times 10^{-6}$ torr. Due to the metering of the constituents in an alternating manner the reactions are self-limiting and the processes provides more control over film composition and thickness than chemical vapor deposition.

In embodiments, the metal borohydride constituent is selected from a composition that is thermally stable at process temperatures of up to 300° C., such as in the range of 30° C. to 300° C., including all values and ranges therein, such as 30° C. to 200° C. Furthermore, the transition metal borohydride constituent is also volatile enough to be delivered to the reaction chamber with or without a carrier gas at room temperature or when heated from 30° C. to 200° C. The metal of the metal borohydride is at least one of: an alkaline earth metal, a transition metal or a combination thereof. In embodiments, the metal of the metal borohydride is selected from one or more of the following: Mg, Ca, Sr, Ba, Sc, Ti, Zr, Hf, V, Nb, Ta, Mo, Mn, Y, La, Ce, Pr, Nd, Sm, Eu, Gd, Tb, Dy, Ho, Er, Tm, Yb and Lu. Complexed with the metal is one or more ligands. In particular embodiments, the metal is a transition metal selected from the group consisting of titanium, yttrium, gadolinium, erbium and combinations thereof.

In embodiments, the metal complex has the formula:

wherein M is at least one of: an alkaline earth metal, a transition metal or a combination thereof such as Mg, Ca, Sr, Ba, Sc, Ti, Zr, Hf, V, Nb, Ta, Mo, Mn, Y, La, Ce, Pr, Nd, Sm, Eu, Gd, Tb, Dy, Ho, Er, Tm, Yb and Lu, L is an anionic ligand including boron, described further below, and D is a neutral coordinating ligand, also described below. Further, x is equal to the oxidation state of M, z is selected from 1 to 3, and y is selected from 0 to 4. Where more than one ligand is present, the ligands may be homoleptic, such as when y=0 or, alternatively, heteroleptic, such as when y=1 to 4.

Anionic ligands, L, include ligands of the following formula:

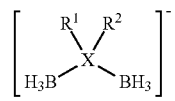

wherein X is nitrogen or phosphorus and $R^1$ and $R^2$ are independently selected from hydrogen or a compound selected from alkyl, haloalkyl, aryl, heteroaryl, trialkylsilyl, alkenyl, alkynyl, halogen, fluoroalkyl, silyalkyl, alkoxy, hydroxyl, amide, boryl and thiolate, wherein the compounds include from 1 to 10 carbon atoms. Examples of neutral coordinating ligands, D, include two-electron donor ligands. In embodiments, neutral coordinating ligands include one or more compositions selected from the following: alkenes, alkynes, ethers, sulfides, amines, nitriles, isonitriles, phosphines, phosphites, arsines and stibines, wherein the compositions include from 1 to 10 carbon atoms.

In embodiments, the anionic ligands, L, include aminodiboronate and phosphinodiboronate. In particular embodiments, the ligands include aminodiboronates of the following formula:

wherein x=2 to 4 and $R_1$ or $R_2$ are individually an alkyl or an aryl group having from 1 to 10 carbons, including all values and ranges therein. In embodiments, $R_1$ and $R_2$ are the same. In other particular embodiments, the ligands include phosphinodiboronate of the following formula:

wherein x=2 to 4 and R is an alkyl or an aryl group having from 1 to 10 carbons, including all values and ranges therein.

In one particular example, the metal aminodiboronate exhibits the following formula:

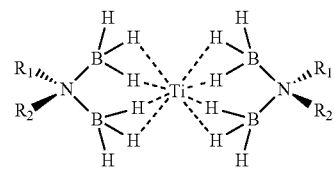

wherein $R_1$ and $R_2$ are individually an alkyl or an aryl group having from 1 to 10 carbons, including all values and ranges therein.

In another particular example, the metal aminiodiboronate exhibits the following formula:

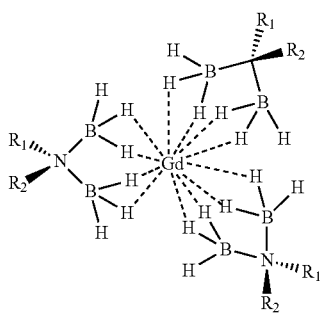

wherein $R_1$ and $R_2$ are individually an alkyl or an aryl group having from 1 to 10 carbons, including all values and ranges therein.

The main-group hydride constituent, or co-reactant, includes hydrogen and a main group alloying element. Main group alloying elements include one or more of the following: aluminum, gallium, silicon, germanium, tin, phosphorous, arsenic and antimony and combinations thereof. Thus, in embodiments, the main-group hydride constituent includes one or more of the following: silane ($SiH_4$), disilane ($Si_2H_6$), trisilane ($Si_3H_8$), neopentylsilane ($Si_5H_{12}$), germane ($GeH_4$), digermane ($Ge_2H_6$), germylsilane ($H_3GeSiH_3$) or ($H_3GeSiMe_3$), and phosphine ($PH_3$).

The resulting metal compounds include at least one of: an alkaline earth metal, a transition metal or a combination thereof, in addition to boron and, optionally, one or more main-group alloying elements and, in particular embodiments, the resulting metal compounds include at least one of: an alkaline earth metal, a transition metal or a combination thereof, in addition to boron and one or more main group alloying elements. Examples of the metal compounds include metal borides, metal borosilicides, metal borogermanides, metal borogermasilicide, metal borophosphides, and combinations thereof. In embodiments, the composition of the deposited metal compounds includes at least one of: an alkaline earth metal, a transition metal or a combination thereof present at a range of 20 atomic percent (at %) to 40 at %, boron present in the range of 20 at % to 80 at %, and optionally an impurity including at least one of carbon, nitrogen, oxygen and phosphorus individually present in the range of 1 at % to 10 at %. In another embodiment, the composition of the metal compounds includes at least one of: an alkaline earth metal, a transition metal or a combination thereof present in the range of 20 at % to 40 at %, boron present in the range of 15 at % to 45 at %, silicon present in the range of 30 at % to 50 at % and one or more optional impurities selected from the group of carbon, nitrogen, phosphorus and oxygen, individually present in the range of 1 at % to 5 at %.

In yet another embodiment, the composition of the metal compounds includes at least one of: an alkaline earth metal a transition metal or a combination thereof present in the range of 20 at % to 40 at %, boron present in the range of 15 at % to 45 at %, germanium present in the range of 30 at % to 50 at % and one or more optional impurities selected from the group of carbon, nitrogen, phosphorus and oxygen, individually present in the range of 1 at % to 5 at %. In a further embodiment, the composition of the metal compounds includes at least one of: an alkaline earth metal, a transition metal or a combination thereof present in the range of 20 at % to 40 at %, boron present in the range of 15 at % to 45 at %, germanium present in the range of 10 at % to 50 at %, silicon present in the range of 10 at % to 50 at %, and one or more optional impurities selected from the group of carbon, nitrogen, phosphorus and oxygen, individually present in the range of 1 at % to 5 at %. In yet a further embodiment, the composition of the metal compounds includes at least one of: an alkaline earth metal, a transition metal or a combination thereof present in the range of 20 at % to 40 at %, boron present in the range of 15 at % to 45 at %, phosphorus present in the range of 20 at % to 50 at % and one or more optional impurities selected from the group of carbon, nitrogen, and oxygen, individually present in the range of 1 at % to 5 at %.

The ranges disclosed above for metal compounds include all values and increments of the ranges, at 0.1 at % increments. Furthermore, additional impurities may be present in the compositions above in the range of 0.1 at % to 2.0 at %. Finally, the elements of the metal compound are present at a total of 100 at %.

In particular examples, the metal compounds include titanium compounds, such as titanium borosilicide compounds, titanium borophosphide compounds, etc. In other particular examples, the metal compounds include erbium compounds such as erbium boride, erbium borosilicide or erbium borophosphide. Other compounds include gadolinium borosilicide, gadolinium borophosphide, yttrium borosilicide and yttrium borophosphide. Furthermore, the resulting materials may exhibit a flatband voltage $V_{fb}$ in the range of −0.5V to −1.0 V when measured on a silicon substrate, including all values and ranges therein.

The metal compounds are deposited as films have a thickness in the range of 1 nm to 50 nm, including all values and increments therein, such as 1 nm to 30 nm. Furthermore, the films are conformal, wherein the films are deposited over all exposed surfaces regardless of the orientation of the surface. In embodiments, the films exhibit a variation in thickness that is +/−35% of the average film thickness, including all values and ranges from +/−1% to +/−35%, such as +/−30%, +/−20%, +/−10%, +/−5%, etc.

In embodiments, the films are deposited over substrates such as silicon, silicon germanide, germanium or silicon carbide. In other embodiments, such as for use as a gate electrode, the films are deposited over relatively high-k dielectrics, exhibiting a dielectric constant of 3.9 or more, such as in the range of 3.9 to 60, including all values and ranges therein. Examples of relatively high-k dielectrics include, for example, $SiO_2$, $HfO_2$, $Al_2O_3$, $ZrO_2$, $TiAlO_x$, $HfAlO_x$, $AlSiO_x$, $HfSiO_x$, $TaSiO_x$ or lanthanide oxides. In other embodiments for use as a gate electrode, the films are deposited on an intervening layer on top of the high-k dielectric material. Examples of this intervening layer include nitrides, carbonitrides and carbo-oxynitrides of molybdenum, tungsten, vanadium, niobium, tantalum, titanium, zirconium and hafnium. In further embodiments, such as for use as a contact, the films are deposited over H-terminated Si, H-terminated silicon germanide, H-terminated Ge, $SiO_2$, $GeO_x$, other metal oxides, metal nitrides, or Group III-V semiconducting materials that are present at the bottom of a contact hole.

Figure 3:
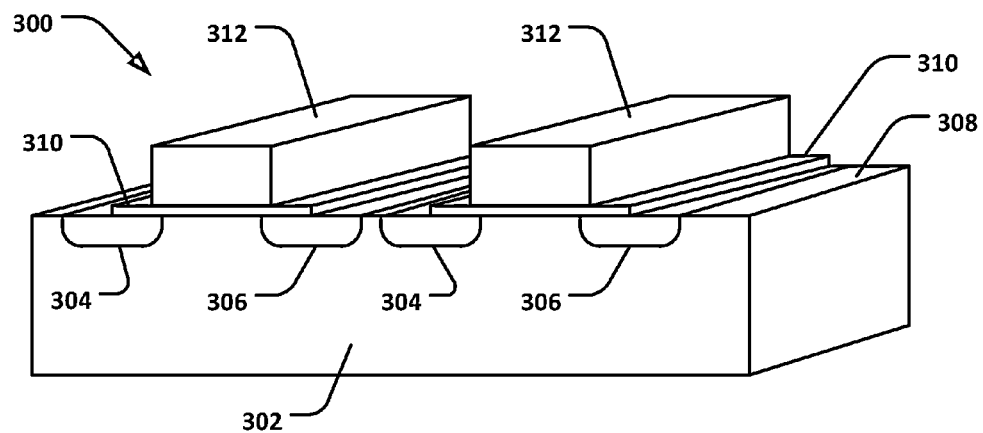
FIG. 3 illustrates a perspective view of a cross-section of an embodiment of a planar CMOS device.

In one embodiment, the films are deposited as an n-type gate in a metal oxide semiconductor transistor. FIG. 3 illustrates an embodiment of a planar transistor 300. The planar transistor includes a semiconductor substrate 302 such as p-doped silicon, germanium or Group III-V semiconductor. A source 304 and drain 306 are formed at the surface 308 of the substrate by doping regions of the substrate by techniques such as ion implantation. For example, the substrate surface is patterned by lithography, wherein a layer of resist is cast on the substrate surface. The resist is patterned by exposing portions of the resist to a form of radiation, including optical radiation, electrons or x-rays. Lithography processes include, for example, optical lithography, immersion lithography, extreme ultraviolet lithography, or x-ray lithography. The resist is developed and a portion of the resist is removed to expose portions of the substrate surface. Optional baking steps are used at various stages of the lithography process. The exposed portions of the substrate surface are then implanted with ions of a desired dopant, such as a p-type of n-type dopant.

The substrate is again patterned using lithography to form a gate oxide 310. The gate oxides are formed of relatively high-k dielectrics, including those set forth above, which are deposited via chemical vapor deposition or atomic layer deposition. The gate oxide thickness is in the range of 1 nm to 10 nm, including all values and ranges therein, such as from 1 nm to 2 nm. The gate oxide layer is then patterned using lithography and a gate 312 of the metal compound is formed over the gate oxide using either the chemical vapor deposition or atomic layer deposition methods described above.

In embodiments of the above, an intervening layer between the gate oxide and the gate is deposited. The composition of the intervening layer is a nitride, carbonitride and carbo-oxynitride of molybdenum, tungsten, vanadium, niobium, tantalum, titanium, zirconium and hafnium. The intervening layer is in the range of 0.5 nm to 3 nm, including all values and ranges therein, and is deposited using atomic layer deposition, chemical vapor deposition or physical vapor deposition. Furthermore, in embodiments, the gate electrode is capped in-situ with a hermetic conductive layer such as, but not limited to Ru(P), Ru(B), TiN, TiAlN, or TaN.

Figure 4:
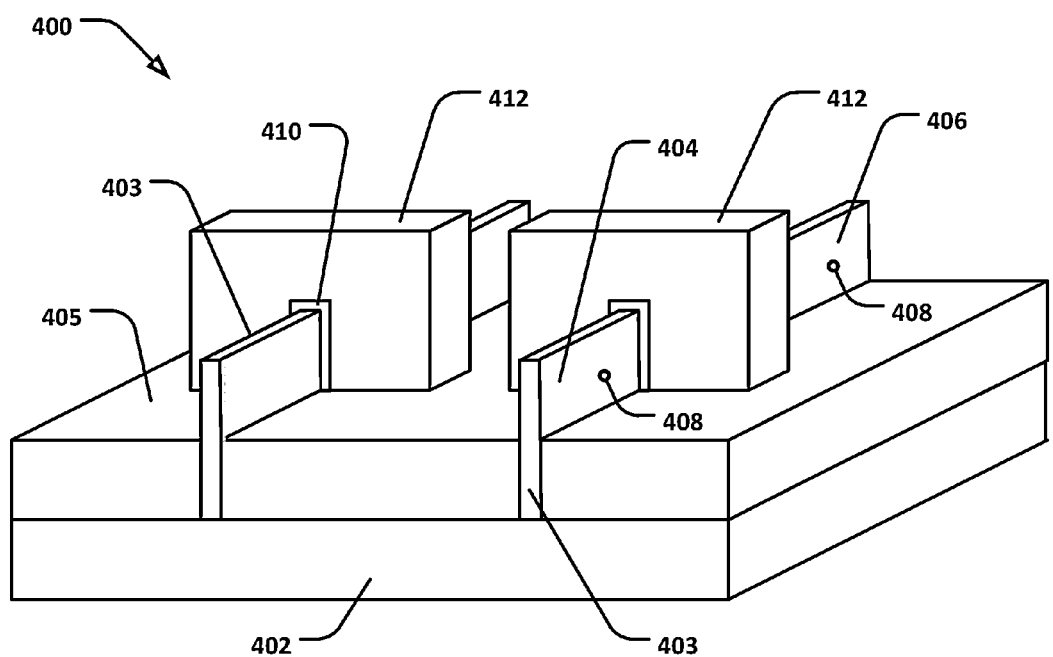
FIG. 4 illustrates a perspective view of a cross-section of an embodiment of a non-planar CMOS device.

FIG. 4 illustrates a non-planar transistor 400 including a semiconductor substrate 402 such as p-doped silicon, germanium or a Group III-V semiconductor. Projecting from the semiconductor substrate is a fin 403 formed from the same material as the substrate or, alternatively, a different semiconductor material than the substrate. In examples, the fin is formed by patterning and etching into the substrate surface. While the fin is illustrated as being three sided, other geometries may be provided as well, such as a two sided fin, a four sided fin, a five sided fin, etc. An oxide layer 405 having a thickness in the range of 1 nm to 100 nm is formed over the substrate. In embodiments, the oxide layer is grown by exposing the substrate to an oxygen rich heated atmosphere. In other embodiments, the oxide layer is deposited using chemical vapor deposition.

A source 404 and drain 406 are formed at the surfaces 408 of the fin 403 by doping regions of the fin 403. Ion implantation techniques, including those before described may be used. The substrate and fin are then patterned with lithography for forming the gate oxide 410. A gate oxide, formed of relatively high-k dielectric material, set forth above, is deposited via chemical vapor deposition or atomic layer deposition. The gate oxide thickness is in the range of 1 nm to 10 nm. The gate oxide layer is then patterned using a similar process and a gate 412 of a metal compound is formed over the gate oxide using the chemical vapor deposition and atomic layer deposition methods described above.

In embodiments of the above, an intervening layer between the gate oxide and the gate is deposited. The intervening layer is selected from the materials described above. The intervening layer is in the range of 0.5 nm to 3 nm, including all values and ranges therein. Furthermore, in embodiments, the gate electrode is capped in-situ with a hermetic conductive layer such as, but not limited to Ru(P), Ru(B), TiN, TiAlN, or TaN.

In addition or alternatively to the above, the metal compounds are employed as source contacts, drain contacts, gate contacts or combinations thereof in planar and non-planar transistors. In such embodiments, the gate material includes the metal compounds or other materials, such as Ta, TaN, TaCN, TaAlN, TaAlC, Ti, TiN, TiCN, TiAlN, TiAlC, VN, TaN, Nb, NbN, Mo, MoN, W and WN/RuO$_2$.

Figure 5:
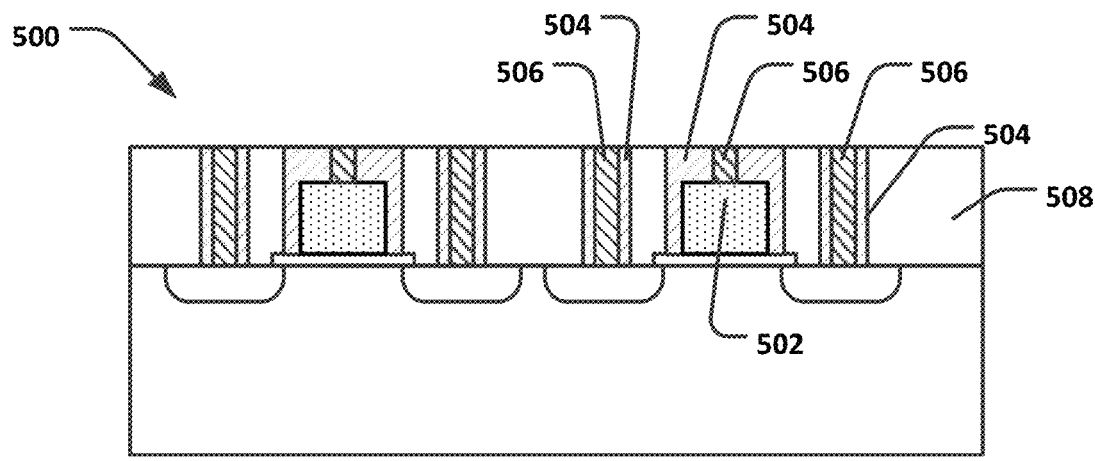
FIG. 5 illustrates a cross-sectional view of an embodiment of a planar CMOS device.

FIG. 5 illustrates an embodiment of a planar transistor 500, building from the structure of the semiconductor, gate oxide and gate described with reference to FIG. 3 above. After forming the gate 502, a capping layer 504, such as the hermetic conductive layer described above, is deposited by physical vapor deposition, chemical vapor deposition or atomic layer deposition. In addition, in embodiments, an interlayer dielectric material 508 is also deposited. The interlayer dielectric is formed from a relatively low k dielectric material exhibiting a dielectric constant that is 3.9 or less such as in the range of 1.0 to 3.9, including all values and ranges therein. Interlayer dielectric materials include, for example, silicon materials, such as fluorine-doped silicon dioxide, carbon doped oxide (i.e., carbon-doped silicon dioxide), organo silicate glass, silicon oxycarbide, hydrogenated silicon oxycarbide, porous silicon dioxide, and organic polymer dielectrics such as polyimide, polytetrafluoroethylene, polynorbornenes, benzocyclobutene, hydrogen silsesquioxane and methylsilsesquioxane. The capping layer 504 and interlayer dielectric 508 are then etched to form contact openings exposing one or more of the source, gate and drain. Using the methods described above, the metal compounds are deposited on the substrate in the contact openings to form the contacts 506.

Figure 6:
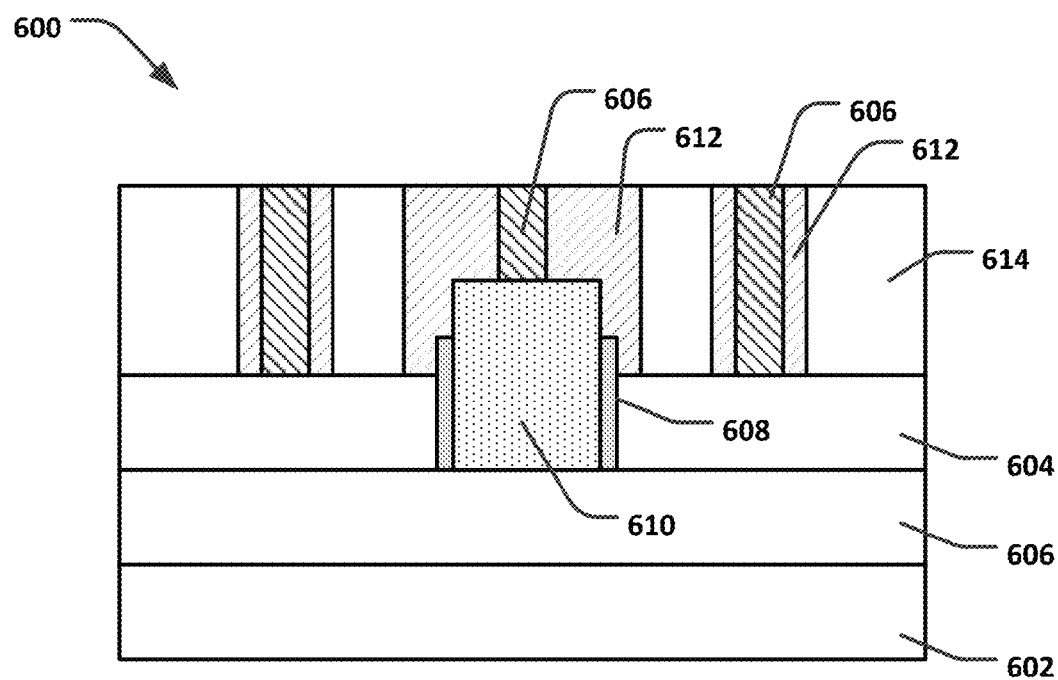
FIG. 6 illustrates a cross-sectional view of an embodiment of a non-planar CMOS device.

FIG. 6 illustrates an embodiment of a non-planar transistor 600 building from the structure of the semiconductor 602, fin 604, oxide layer 606, gate oxide 608 and gate 610 described above in FIG. 4. After forming the gate 610, a capping layer 612, such as a hermetic conductive layer described above, is deposited by physical vapor deposition, chemical vapor deposition or atomic layer deposition. An interlayer dielectric material 614 is also deposited in embodiments using the relatively low-k dielectric materials. The capping layer 612 and interlayer dielectric 614 are then patterned and etched to form contact openings exposing one or more of the source, gate and drain. Using method described above, the metal compounds are deposited in the contact opening on the substrate to form a contact 606.

Figure 7A:
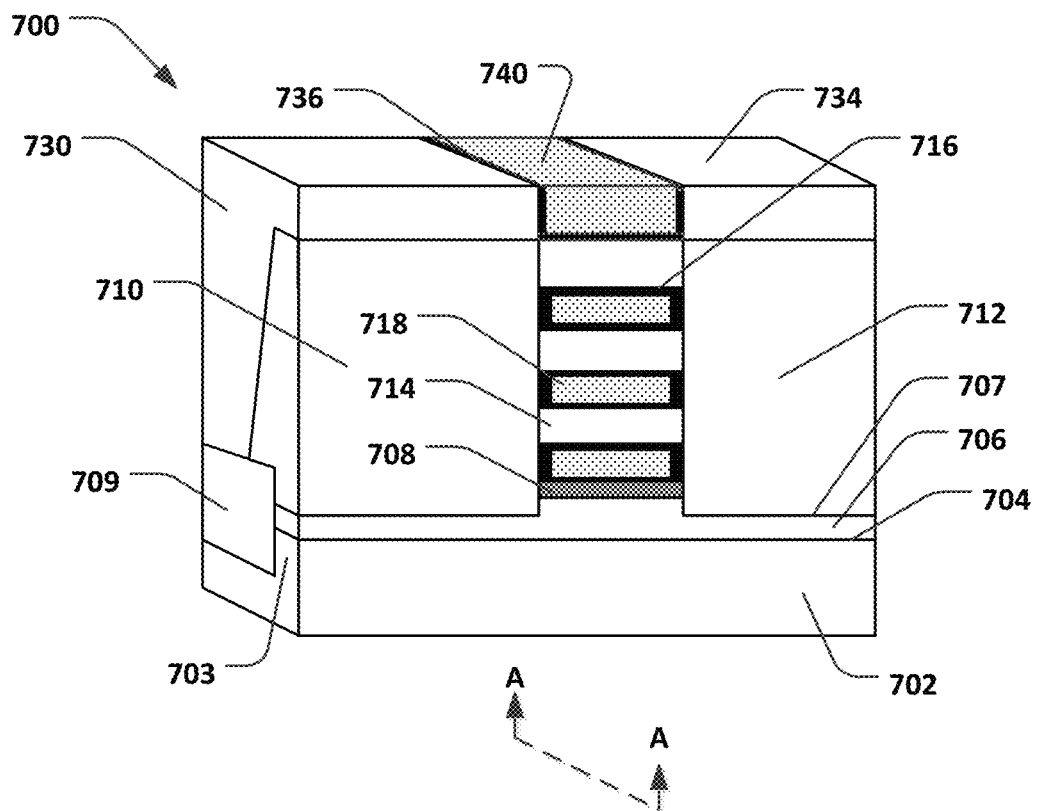
FIG. 7*a* illustrates a cross-sectional view of an embodiment of gate all around nanowire CMOS device.
Figure 7B:
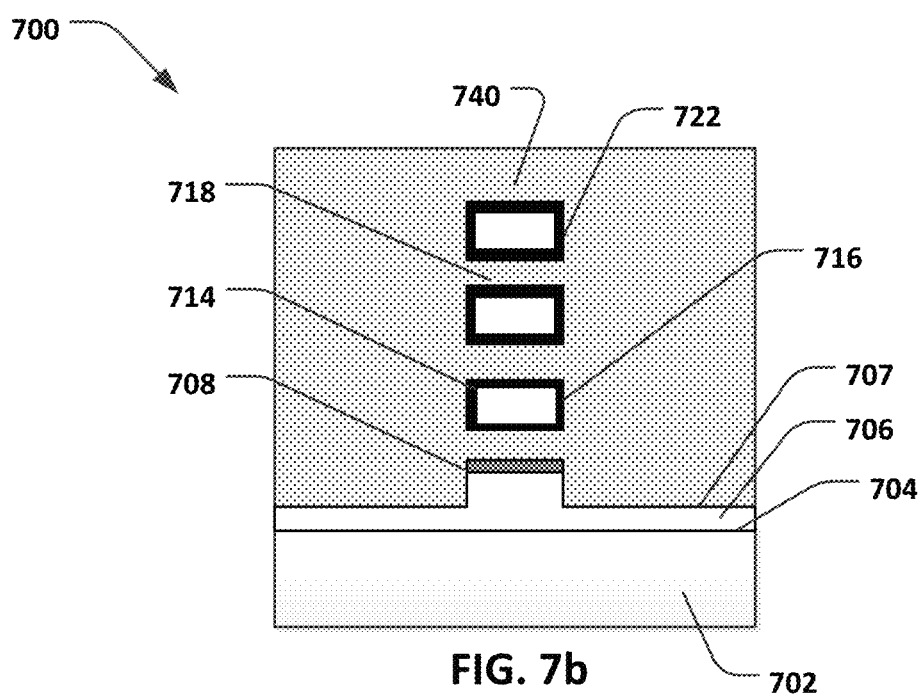
FIG. 7*b* illustrates a cross-sectional view of the embodiment of FIG. 7*a* taken at A-A.

The configuration of the semiconductor device need not be limited to those described above. For example, the semiconductor devices can include gate all around device architectures and further variations. FIGS. 7a and 7b illustrate an embodiment of a non-planar gate all-around device. The device 700 includes a semiconductor substrate 702 having a top surface 704. The substrate 702 may include, for example, p-doped silicon, germanium or a Group III-V semiconductor. A fin 703 is formed in the upper surface of the semiconductor by patterning and etching the substrate as described above or forming a fin onto the substrate surface.

A buffer layer 706 is optionally provided. In embodiments, the buffer layer is deposited using, for example, atomic layer deposition, chemical vapor deposition or physical vapor deposition. The buffer layer includes, for example, one or more layers of alternating materials, and is selected based on the composition of the substrate and nanowires. The composition of the buffer layer may be deposited in a gradient, such that a relatively higher percentage of one material in the overall buffer composition is deposited near the substrate surface and a relatively higher percentage of another material in the overall buffer composition is deposited at the upper surface of the buffer layer 707. The buffer layers may provide a transition in the lattice constant between the substrate and the layer deposited over the buffer. The material selected for the buffer layer may include e.g. one or more of Si, Ge, GeSn, SiGe, GaAs, InSb, GaP, GaSb, InAlAs, InGaAs, GaSbP, GaAsSb, GaN, GaP, and InP.

Over the fin 703 is deposited an intervening layer 708 or the fin itself may form an intervening layer. The intervening layer may be in the range of 1 nm to 10 nm, including all values and ranges therein. The intervening layer including those compositions mentioned in the embodiments above.

Then alternating layers of the nanowire semiconductor material 714 and a sacrificial material (not illustrated) are deposited. The channel nanowires 714 are formed from, for example, p-doped silicon, germanium or a Group III-V semiconductor. The sacrificial material may also be formed from these materials; however, the lattice constant of the selected nanowire material and the sacrificial material may be different. In particular embodiments from 3 to 6 layers of nanowire material is deposited and from 3 to 6 layers of sacrificial material is deposited. In addition, the channel nanowires 714 may run parallel to the top surface 704 of the substrate 702.

The layers of the nanowire and sacrificial material are deposited by, for example, chemical vapor deposition, atomic layer deposition or physical vapor deposition. Each layer exhibits a thickness in the range of 3 nm to 50 nm including all values and ranges therein. If the layers are deposited by blanket deposition, the optional buffer, optional intervening layer, nanowire and sacrificial material are then patterned and etched building on the fin base.

Shallow trench isolation regions 709 may be deposited on either side of the fin 703 and buffer layer 706, when present, reducing leakage between adjacent transistors. Again, physical vapor deposition, chemical vapor deposition or atomic layer deposition may be used to deposit the shallow trench materials. The shallow trench isolation regions include, for example, dielectric materials, such as silicon oxide, silicon nitride, silicon oxynitride or other dielectric materials exhibiting a dielectric constant of 3.9 or less, such as in the range of 1.0 to 3.9. Once formed, the shallow trench isolation region may be etched.

In embodiments, a sacrificial gate electrode is formed over the fin and a sacrificial dielectric layers on either side of the gate electrode are formed not illustrated. Then a source 710 and a drain 712 are deposited over the substrate, optional buffer 706 and shallow trench isolation regions 708 on either side of the sacrificial gate electrode and dielectric layers. The source and drain regions may be formed using epitaxial deposition methods such as low pressure chemical vapor deposition, vapor phase epitaxy, and molecular beam epitaxy. In embodiments, the source and drain are grown from a surface of the substrate below the fin. Coupling the source 710 and drain regions 712 are the channel nanowires 714. In examples, the source and drain regions exhibit a lattice constant that is different from that of the substrate causing a lattice mismatch between the source and drain regions and the substrate.

The source and drain regions include, for example, semiconductor materials such as p-doped silicon, germanium or a Group III-V semiconductor. The source and drain are then doped to provide a p-type or n-type material. Doping concentrations may be in the range of 1E18 atoms/cm$^3$ to 1E21 atoms/cm$^3$, including all values and ranges therein. In particular embodiments, the source and drain are doped to provide an n-type material to form an N-MOS transistor. In embodiments the source and drain regions are formed from the same material as the nanowires 714.

After forming the source and drain regions all of the sacrificial regions, including the sacrificial gate electrode, sacrificial dielectric layers on either side of the gate, and the sacrificial material between the nanowires are removed. With the removal of the sacrificial gate electrode and dielectric layers, the perimeter of the nanowires are exposed, including one or more surfaces 722 (see FIG. 7b).

Gate dielectric layers 716 are then formed on and around the perimeter surface of each channel nanowire 714. The gate dielectric layers are formed using conformal coating methods such as low pressure chemical vapor deposition or atomic layer deposition. The gate dielectric 716 include the gate oxide materials, formed of relatively high-k dielectric material, set forth above, etc. The gate dielectrics may have a thickness in the range of 10 angstroms to 60 angstroms including all values and ranges therein.

A gate electrode 718 is then formed on the wire perimeter surfaces over the gate dielectric layers 716 and surrounds each wire. The gate electrode is formed from the material compounds described herein and are deposited using conformal coating methods such as atomic layer deposition or chemical vapor deposition.

An interlayer dielectric 730 is deposited over the structures using vapor deposition methods such as chemical vapor deposition, physical vapor deposition and atomic layer deposition. The interlayer dielectric is formed from, for example, undoped silicon oxide, doped silicon oxide (BPSG, PSG), silicon nitride, silicon oxynitride, etc. The surface 734 of the interlayer dielectric 730 is patterned and etched and a gate dielectric 736 is deposited over the nanowires 714. The gate dielectric including the gate oxide materials described above. The gate dielectric 736 is etched, leaving a trench and a gate electrode 740 is deposited into the etched surface of the gate dielectric 736, wherein the gate electrode 740 is formed of the metal compounds produced by the methods described above.

In embodiments, one or more of the transistors or semiconductor devices are provided in an integrated circuit, which may include various components or are associated with various components. Components include, for example, transistors, diodes, power sources, resistors, capacitors, inductors, sensors, transceivers, receivers, antennas, etc. Components associated with an integrated circuit include those that are mounted on an integrated circuit or those connected to an integrated circuit. The integrated circuit is either analog or digital and may be used in a number of applications, such as microprocessors, optoelectronics, logic blocks, audio amplifiers, etc., depending on the components associated with the integrated circuit. The integrated circuit may be employed as part of a chipset for executing one or more related functions in a computer or a mobile device, such as a mobile phone or tablet.

Without being bound to any particular theory, the deposited metal compounds have relatively good nucleation characteristics on H-terminated Si or Ge surfaces, creating relatively clean, stable interfaces. In addition, due to the presence of the alloying elements, the electropositive metal alloy material work function can be tuned by choice of the metal as well as the other elements present in the material, such as Si, Ge and P. Furthermore, due to the presence of these other elements, the electropositive metal atoms are chemically bound in the alloy allowing for direct deposition of the metal compounds onto active Si or SiGe or directly onto relatively high-k dielectric surfaces, which eliminates in some embodiments the need for an intervening diffusion barrier, such that no diffusion barrier is present in the gate stack as between the gate oxide and gate.

EXAMPLES

Example 1

Figure 8:
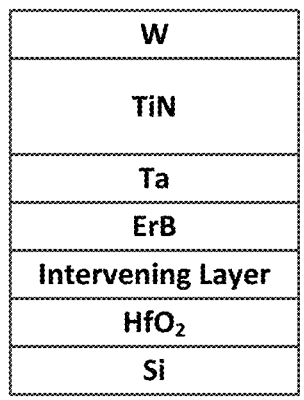
FIG. 8 illustrates a schematic of a gate stack of Example 1.

An NMOS gate stack was prepared with a 15 nm ErB film as the gate metal. The ErB film was deposited using atomic layer deposition over an $HfO_2$ gate oxide layer and an intervening layer as previously described which were also deposited using atomic layer deposition. During deposition of the ErB film, a p-well silicon substrate was heated to a temperature of 200° C. in a reaction chamber held under vacuum at a pressure of approximately 1 torr. The first constituent, erbium aminodiboronate, was heated to 105° C. to develop sufficient vapor pressure, was carried into the chamber using 75 sccm of Ar push gas and deposited on the surface of the barrier/reliability layer. Excess first constituent was purged from the reaction chamber. Then, the second constituent, silane ($SiH_4$), was introduced with a flow rate of 100 sccm and deposited. Excess constituent was evacuated from the chamber using an Ar purge gas flowing at 700 sccm. This was repeated until an ~15 nm layer (measured at 14.74 nm) of ErB was deposited. After deposition of the ErB metal compound film, a hermetic cap was deposited. The hermetic cap included a tantalum adhesion layer deposited via physical vapor deposition at a thickness of 22.64 nm and a titanium nitride barrier layer deposited via physical vapor deposition at a thickness of 52.76 nm. Finally, a tungsten layer was deposited over the titanium nitride layer at a thickness of 12.30 nm using physical vapor deposition. A schematic of the gate stack is illustrated in FIG. 8. The gate stack was subjected to a forming gas anneal (FGA) for a time period of 1 hour and a temperature of 350° C. (5% $H_2$/95% $N_2$).

Figure 9:
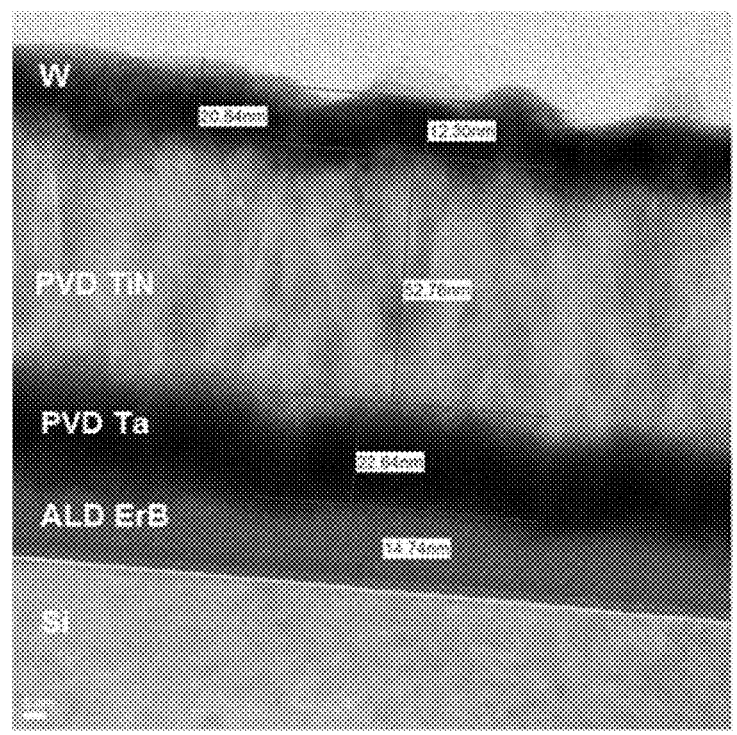
FIG. 9 illustrates an XTEM image of a gate stack of Example 1.

FIG. 9 illustrates a XTEM image of the gate stack. X-ray photoelectron spectroscopy (XPS) without an air break on an uncapped ErB film indicated that a composition of 32 at % Er, 60 at % B, and 6% C was present in the ErB layer. Energy dispersive x-ray spectroscopy (EDS) did not detect any tantalum from the hermetic cap in the ErB layer.

Example 2

Figure 10:
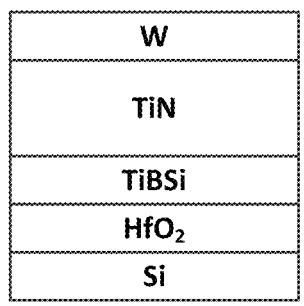
FIG. 10 illustrates a TEM image of Example 2.

A gate stack was prepared with a TiBSi film as the gate. The TiBSi film was deposited using chemical vapor deposition over an $HfO_2$ gate oxide layer, which was deposited using atomic layer deposition. During deposition of the TiBSi film, a p-well silicon substrate was heated at a temperature of 150° C. in a reaction chamber held under vacuum at a pressure of approximately 1 torr. The metal borohydride constituent, $Ti(H_3BN(Me)_2NH_3)_2$, was heated to 40° C. to develop sufficient vapor pressure and metered into the reaction chamber using a carrier gas of 25 sccm Ar. It was coflowed in the chamber with the second constituent silane ($SiH_4$) flowing at 100 sccm, to deposit a film on the surface of the $HfO_2$. X-ray photoelectron spectroscopy (XPS) performed without an air break indicated that a composition of 29 at % Ti, 22 at % B, 44 at % Si, 4 at % C and 1 at % N was present in the TiBSi layer. After deposition of the TiBSi metal compound film, a hermetic cap was deposited by physical vapor deposition that included a 30 to 60 nm thick titanium nitride barrier layer. Finally a tungsten layer was deposited over the titanium nitride layer at a thickness of 15 nm using physical vapor deposition. The gate stack illustrated in FIG. 10 was then subjected to an end of line (EOL) forming gas anneal (FGA) for a time period of 60 minutes and a temperature of 350° C. (5% $H_2$/95% $N_2$).

Thus, an aspect of the present disclosure relates to a method of forming a semiconductor. The method includes heating a substrate in a reaction chamber. The method also includes supplying to the reaction chamber a first constituent including a metal borohydride, wherein the metal borohydride includes at least one of an alkaline earth metal, a transition metal, or a combination thereof. The method further includes supplying to the reaction chamber a main-group hydride constituent, wherein the hydride is a compound of hydrogen and a main group alloying element includes one or more elements selected from the following: aluminum, gallium, silicon, germanium, tin, phosphorous, arsenic, antimony and combinations thereof. In addition, the method includes depositing a metal compound on the substrate, wherein the metal compound comprises a) the alkaline earth metal, the transition metal or the combination thereof, b) boron, and c) optionally the main group alloying element.

In embodiments of the above, the method further includes depositing a gate oxide on the substrate surface and depositing the metal compound on the gate oxide to form a gate. In addition, or in alternative embodiments, the method further includes forming a source and drain in the substrate; depositing a gate oxide on the substrate surface; depositing a gate on the substrate surface; depositing an interlaying dielectric on the substrate; forming contact holes exposing one or more of the source, drain and gate; and depositing the metal compound in the contact hole.

In any of the above embodiments, the first constituent comprises a metal complex having the formula:

wherein M is the alkaline earth metal, the transition metal or the combination thereof selected from Mg, Ca, Sr, Ba, Sc, Ti, Zr, Hf, V, Nb, Ta, Mo, Mn, Y, La, Ce, Pr, Nd, Sm, Eu, Gd, Tb, Dy, Ho, Er, Tm, Yb and Lu, L is an anionic ligand of the following formula:

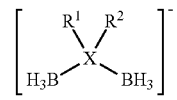

wherein X is nitrogen or phosphorus and $R^1$ and $R^2$ are independently selected from hydrogen, alkyl, haloalkyl, aryl, heteroaryl, trialkylsilyl, alkenyl, alkynyl, halogen, fluoroalkyl, silyalkyl, alkoxy, hydroxyl, amide, boryl and thiolate, and D is a neutral coordinating ligand, x is equal to the oxidation state of M, z is selected from 1 to 3, and y is selected from 0 to 4.

Further, in embodiments of the above, the neutral coordinating ligand comprises a neutral coordinating ligand selected from the group consisting of alkenes, alkynes, ethers, sulfides, amines, nitriles, isonitriles, phosphines, phosphites, arsines, and stibines, wherein the ligand includes 1 to 10 carbon atoms.

In particular embodiments of the above, the first constituent comprises one of the following: 1) a metal aminodiboronate comprising a complex of metal and one or more aminodiboronate ligands; 2) a metal phosphinodiboronate comprising a complex of metal and one or more phosphinodiboronate ligands; and 3) a combination of the metal aminodiboronate and the metal phosphinodiboronate, wherein the metal is the alkaline earth metal, the transition metal, or the combination thereof.

In any of the above, embodiments, the metal compound exhibits flatband voltage the range of −0.5 V to −1.0 V. In addition, in any of the embodiments above, the alkaline earth metal, the transition metal or the combination thereof is present in the range of 20 atomic percent to 40 atomic percent of the metal compound.

Further, in any of the embodiments of the above, the metal compound includes one or more of the following: a metal boride, a metal borosilicide, a metal borogermanide, a metal borogermasilicide and a metal borophosphide, wherein the metal is the alkaline earth metal, the transition metal or the combination thereof. In particular embodiments of the above, the transition metal is selected from the group consisting of titanium, yttrium, gadolinium, erbium and combinations thereof. And, in further particular embodiments of the above, the metal compound comprises one of the following: titanium borosilicide, titanium borophosphide, erbium boride, erbium borosilicide, erbium borophosphide, gadolinium borosilicide, gadolinium borophosphide, yttrium borosilicide, and yttrium borophosphide.

In any of the above embodiments, the substrate includes a fin extending from the substrate, the fin includes fin surfaces, and the substrate surface includes the fin surfaces. In addition, or alternatively, in any of the above embodiments, the substrate includes a nanowire, the nanowire includes surfaces forming a perimeter and the metal compound is deposited on the perimeter surfaces.

Another aspect of the present disclosure relates to a transistor. The transistor includes a substrate including a surface. The transistor also includes a gate oxide disposed on the substrate surface, wherein the gate oxide comprises a dielectric constant of greater than 3.9. The transistor further includes a gate disposed on the gate oxide opposing the substrate surface, wherein the gate comprises a metal compound and the metal compound comprises a) at least one of: an alkaline earth metal, a transition metal, or a combination thereof, b) boron, and c) a main group alloying element selected from the following: aluminum, gallium, silicon, germanium, tin, phosphorous, arsenic, antimony, and combinations thereof, wherein the alkaline earth metal, transition metal, or the combination thereof is present in the range of 20 to 40 at % percent and the compound includes less than 10% of impurities.

In embodiments of the above, the metal compound exhibits a flatband voltage the range of −0.5 V to −1.0V. In addition, in embodiments of the above, the transition metal is selected from the group consisting of titanium, yttrium, gadolinium or erbium. In further embodiments of the above, the metal compound comprises one of the following: titanium borosilicide, titanium borophosphide, erbium boride, erbium borosilicide, erbium borophosphide, gadolinium borosilicide, gadolinium borophosphide, yttrium borosilicide and yttrium borophosphide.

In any of the above embodiments, the substrate includes a fin extending from the substrate, the fin includes fin surfaces, and the substrate surface includes the fin surfaces. In addition, or alternative, in any of the above embodiments, the substrate includes a nanowire, the nanowire includes surfaces forming a perimeter and the metal compound is deposited on the perimeter surfaces.

In any of the above embodiments the transistor is formed by the methods set forth above.

In yet a further aspect, the present disclosure relates to a semiconductor device. The device includes a semiconductor substrate including a surface, a source and a drain formed in the semiconductor surface. In addition, the device includes a gate oxide disposed on the substrate surface, wherein the gate oxide comprises a dielectric constant of greater than 3.9. The device also includes a gate disposed on the gate oxide opposing the substrate surface. The device further includes a contact deposited on one or more of the following: the source, the drain and the gate, wherein the contact comprises a metal compound and the metal compound comprises a) at least one of: an alkaline earth metal, a transition metal, or a combination thereof, present in the range of 20 atomic at percent to 40 atomic percent, b) boron and c) a main group alloying element selected from the following: aluminum, gallium, silicon, germanium, tin, phosphorous, arsenic, antimony and combinations thereof, wherein the alkaline earth metal, the transition metal, or the combination thereof is present in the range of 20 to 40 at % percent and the compound includes less than 10% of impurities. Furthermore, in embodiments, the gate also comprises the metal compound.

In embodiments of the above, the metal compound exhibits flatband voltage the range of −0.5 V to −1.0V. In addition, in embodiments of the above, the transition metal is selected from the group consisting of titanium, yttrium, gadolinium or erbium. Also, in embodiments of the above, the metal compound comprises one of the following: titanium borosilicide, titanium borophospide, erbium boride, erbium borosilicide, erbium borophosphide, yttrium borosilicide and yttrium borophosphide.

In any of the above embodiments, the substrate includes a fin extending from the substrate, the fin includes fin surfaces, and the substrate surface includes the fin surfaces. In addition, or alternatively, in any of the above embodiments, the substrate includes a nanowire, the nanowire includes surfaces forming a perimeter and the metal compound is deposited on the perimeter surfaces.

In any of the above embodiments, the semiconductor device is an integrated circuit.

Further, any of the above embodiments, are formed using the methods described above.

The foregoing description of several methods and embodiments has been presented for purposes of illustration. It is not intended to be exhaustive or to limit the claims to the precise steps and/or forms disclosed, and obviously many modifications and variations are possible in light of the above teaching. It is intended that the scope of the invention be defined by the claims appended hereto.

What is claimed is:

1. A method of forming a semiconductor, comprising:
heating a substrate in a reaction chamber;
supplying to the reaction chamber a first constituent including a metal borohydride, wherein said metal borohydride includes at least one of: an alkaline earth metal, a transition metal or a combination thereof;
supplying to the reaction chamber a main-group hydride constituent, wherein the hydride is a compound of hydrogen and a main group alloying element includes one or more elements selected from the following: aluminum, gallium, silicon, germanium, tin, phosphorous, arsenic, antimony and combinations thereof; and
depositing a metal compound on the substrate, wherein the metal compound comprises a) the alkaline earth metal, the transition metal or the combination thereof, b) boron and c) optionally the main group alloying element.

2. The method of claim 1, further comprising depositing a gate oxide on the substrate surface and depositing the metal compound on the gate oxide to form a gate.

3. The method of claim 1, further comprising forming a source and drain in the substrate; depositing a gate oxide on the substrate surface; depositing a gate on the substrate surface; depositing an interlaying dielectric on the substrate; forming contact holes exposing one or more of the source, drain and gate; and depositing the metal compound in the contact hole.

4. The method of claim 1, wherein the alkaline earth metal, transition metal or combination thereof is present in the range of 20 to 40 at % of the metal compound.

5. The method of claim 1, the first constituent comprises a metal complex having the formula:

wherein M is the alkaline earth metal, transition metal or the combination thereof selected from Mg, Ca, Sr, Ba, Sc, Ti, Zr, Hf, V, Nb, Ta, Mo, Mn, Y, La, Ce, Pr, Nd, Sm, Eu, Gd, Tb, Dy, Ho, Er, Tm, Yb and Lu, L is an anionic ligand of the following formula:

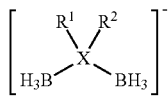

wherein X is nitrogen or phosphorus and $R^1$ and $R^2$ are independently selected from hydrogen, alkyl, haloalkyl, aryl, heteroaryl, trialkylsilyl, alkenyl, alkynyl, halogen, fluoroalkyl, silyalkyl, alkoxy, hydroxyl, amide, boryl and thiolate, and D is a neutral coordinating ligand, x is equal to the oxidation state of M, z is selected from 1 to 3, and y is selected from 0 to 4.

6. The method of claim 5, wherein the neutral coordinating ligand comprises a neutral coordinating ligand selected from the group consisting of alkenes, alkynes, ethers, sulfides, amines, nitriles, isonitriles, phosphines, phosphites, arsines, and stibines, wherein said ligand includes 1 to 10 carbon atoms.

7. The method of claim 1, wherein the first constituent comprises one of the following: 1) a metal aminodiboronate comprising a complex of a metal and one or more aminodiboronate ligands; 2) a metal phosphinodiboronate comprising a complex of a metal and one or more phosphinodiboronate ligands; and 3) a combination of the metal aminodiboronate and the metal phosphinodiboronate, wherein the metal is the alkaline earth metal, transition metal or the combination thereof.

8. The method of claim 1, wherein the metal compound includes one or more of the following: a metal boride, a metal borosilicide, a metal borogermanide, a metal borogermasilicide and a metal borophosphide, wherein the metal is the alkaline earth metal, transition metal or combination thereof.

9. The method of claim 7, wherein the transition metal is selected from the group consisting of titanium, yttrium, gadolinium, erbium and combinations thereof.

10. The method of claim 1, wherein the metal compound comprises one of the following: titanium borosilicide, titanium borophosphide, erbium boride, erbium borosilicide, erbium borophosphide, gadolinium borosilicide, gadolinium borophosphide, yttrium borosilicide and yttrium borophosphide.

11. The method of claim 1, wherein the substrate includes a fin extending from the substrate, the fin includes fin surfaces, and the substrate surface includes the fin surfaces.

12. The method of claim 1, wherein the substrate includes a nanowire, said nanowire includes surfaces forming a perimeter and said metal compound is deposited on said perimeter surfaces.

13. The method of claim 1, wherein the metal compound exhibits flatband voltage the range of −0.5 V to −1.0 V.

* * * * *